(12) United States Patent
Lee

(10) Patent No.: US 7,298,664 B2
(45) Date of Patent: Nov. 20, 2007

(54) INTERNAL POWER SUPPLY VOLTAGE GENERATING CIRCUIT WITH REDUCED LEAKAGE CURRENT IN STANDBY MODE

(75) Inventor: Sang Kwon Lee, Yongin-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 146 days.

(21) Appl. No.: 11/304,621

(22) Filed: Dec. 16, 2005

(65) Prior Publication Data

US 2006/0250179 A1   Nov. 9, 2006

(30) Foreign Application Priority Data

May 3, 2005   (KR) ...................... 10-2005-0037090

(51) Int. Cl.
*G11C 5/14* (2006.01)
(52) U.S. Cl. ...................... 365/229; 365/227; 365/228
(58) Field of Classification Search ................ 365/229, 365/226, 227, 228; 327/530, 534–537, 543
See application file for complete search history.

(56) References Cited

U.S. PATENT DOCUMENTS

| | | | |
|---|---|---|---|
| 5,189,316 A | 2/1993 | Murakami et al. | |
| 5,300,823 A | 4/1994 | Ihara | |
| 6,025,707 A | 2/2000 | Joo | |
| 6,535,433 B2* | 3/2003 | Ooishi | 365/189.05 |
| 6,586,963 B2* | 7/2003 | Choi et al. | 326/26 |
| 6,590,444 B2 | 7/2003 | Ikehashi et al. | |
| 6,735,142 B1* | 5/2004 | Oh | 365/227 |
| 2002/0135398 A1* | 9/2002 | Choi et al. | 326/93 |
| 2007/0008802 A1* | 1/2007 | Joo et al. | 365/226 |

FOREIGN PATENT DOCUMENTS

| | | |
|---|---|---|
| JP | 08-147998 | 6/1996 |
| JP | 11-003586 | 1/1999 |
| JP | 11-068039 | 3/1999 |
| KR | 1020010078149 | 8/2001 |

* cited by examiner

*Primary Examiner*—Son Dinh
*Assistant Examiner*—Hien N Nguyen
(74) *Attorney, Agent, or Firm*—Lowe Hauptman Ham & Berner LLP

(57) ABSTRACT

An internal power supply voltage generating circuit of semiconductor memory devices configured such that only a predetermined internal power driver is driven but the remaining internal power drivers are not driven, in a standby mode so that the leakage current in standby mode is reduced and the standby current is thus reduced. Furthermore, the leakage current of an internal power driver that does not operate in the standby mode is reduced using a high voltage as a back bias of the internal power driver.

11 Claims, 3 Drawing Sheets

INTERNAL POWER SUPPLY VOLTAGE GENERATING CIRCUIT WITH REDUCED LEAKAGE CURRENT IN STANDBY MODE

BACKGROUND

1. Field of the Invention

The present invention relates to an internal power supply voltage generating circuit of semiconductor memory devices. More specifically, the present invention relates to an internal power supply voltage generating circuit with reduced standby current of a Pseudo Static Random Access Memory (PSRAM).

2. Discussion of Related Art

Generally, the standby current of a PSRAM consists of the consumption current of internal circuits of semiconductor memory devices, the refresh current, and the leakage current. In the prior art, the ratio of the leakage current to the standby current is very small. As transistors and various elements gradually become very small, the ratio of the leakage current to the standby current becomes very large and cannot be ignored. This leakage current is mostly a channel leakage current of the transistor and is proportional to the width of the transistor. As mobile devices become popular, the need for low-power and high-density memory becomes important. Thus, an increase of the leakage current becomes a significant problem.

FIG. 1 is a block diagram of an internal power supply voltage generating circuit and internal circuits using an internal power supply voltage.

Referring to FIG. 1, the internal power supply voltage generating circuit 10 includes a plurality of internal power drivers 10-1 to 10-n. Each of the internal power drivers 10-1 to 10-n generates an external power supply voltage (Vext) and an internal power supply voltage (Vint). The generated internal power supply voltage (Vint) is used to drive internal circuits of semiconductor memory devices such as a high voltage (VPP) generator 20, a cell power supply voltage (Vcore) generator 30 and a peripheral circuit 40.

Each of the internal power drivers 10-1 to 10-n is under the control of a deep power-down detection signal (PWb). The deep power-down detection signal (PWb) becomes a logical high in deep power-down mode to turn off the PMOS transistors of the internal power drivers 10-1 to 10-n, and becomes a logical low in modes other than the deep power-down mode to turn on the PMOS transistors of the internal power drivers 10-1 to 10-n. If the PMOS transistors of the internal power drivers 10-1 to 10-n are turned on, the current flows and the internal power supply voltage (Vint) is generated.

The internal power supply voltage drivers 10-1 to 10-n generate the current in order to generate the internal power supply voltage (Vint) in standby mode. However, the current generated in the internal power drivers 10-1 to 10-n become the origin of the leakage current in standby mode.

One method of reducing the leakage current is to reduce the width of the PMOS transistors of the internal power drivers 10-1 to 10-n. It is, however, impossible to reduce the width of the internal power drivers 10-1 to 10-n constantly. This is because the current (i.e., the internal power supply voltage) necessary for the operation (driving) of the internal circuits must be supplied in a mode other than the standby mode or the deep power-down mode.

SUMMARY OF THE INVENTION

An object of the present invention is to reduce the leakage current in standby mode by driving only a predetermined internal power driver but not driving the remaining internal power drivers in standby mode.

Another object of the present invention is to reduce the leakage current of an internal power driver that does not operate in standby mode by using a high voltage as a back bias of the internal power driver.

According to an aspect of the present invention, there is provided an internal power supply voltage generating circuit, including at least one or more first internal power drivers configured not to generate an internal voltage in deep power-down mode, but to generate an internal power supply voltage in all modes other than the deep power-down mode and standby mode, and a plurality of second internal power drivers configured not to generate the internal power supply voltage in the deep power-down mode and the standby mode, but to generate the internal power supply voltage all mode other than deep power-down mode and standby mode.

According to another aspect of the present invention, there is provided an internal power supply voltage generating circuit, including at least one or more first internal power drivers configured to generate an internal power supply voltage in all modes other than the deep power-down mode, and the standby mode, a plurality of controllers configured to transfer a high voltage in the standby mode and transfer the internal power supply voltage in all modes other than the standby mode, and a plurality of second internal power drivers configured to receive the internal power supply voltage from each of the plurality of controllers as a back bias in all modes other than the deep power-down mode and standby mode and generate the internal power supply voltage, and to receive the high voltage from each of the plurality of controllers as a back bias in the standby mode and preclude the leakage current.

DETAILED DESCRIPTION OF PREFERRED EMBODIMENTS

Embodiments according to the present invention will be described with reference to the accompanying drawings. Since the embodiments are provided so that a person of ordinary skill in the art will be able to understand the present invention, they may be modified in various manners and the scope of the present invention is not limited by the embodiments described herein.

According to the present invention, in a standby mode, only internal power drivers necessary for the operation of internal circuits (i.e., the minimum internal power supply voltage level necessary to drive the internal circuits is maintained) are driven, and the remaining internal power drivers are not driven. Therefore, the leakage current in standby mode can be reduced.

Figure 1:
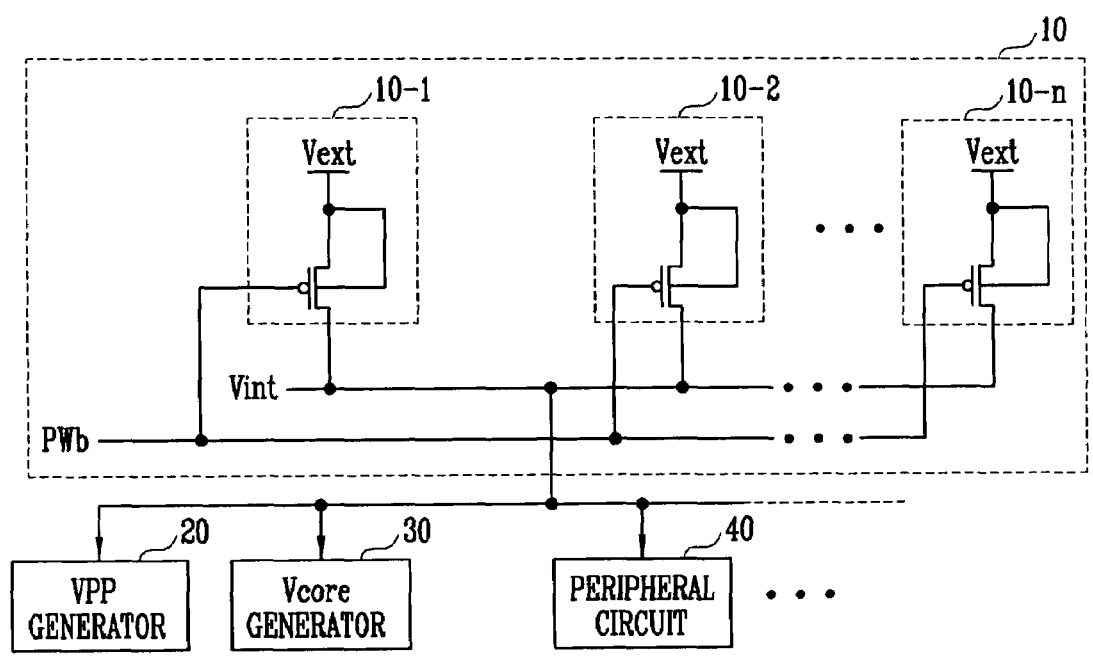
FIG. 1 is a block diagram of a conventional internal power supply voltage generating circuit.
Figure 2:
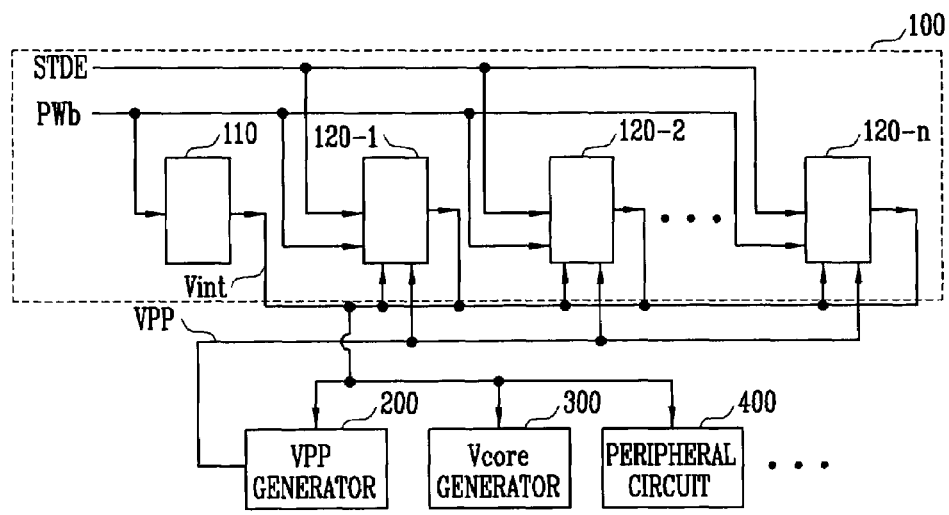
FIG. 2 is a block diagram of an internal power supply voltage generating circuit and internal circuits using the internal power supply voltage according to an embodiment of the present invention.

FIG. 2 is a block diagram of an internal power supply voltage generating circuit and internal circuits according to an embodiment of the present invention.

Referring to FIG. 2, the internal power supply voltage generating circuit 100 includes at least one or more first internal power drivers 110 and a plurality of second internal power drivers 120-1 to 120-n to reduce the leakage current in a standby mode.

The first internal power drivers 110 are provided to supply the current necessary for the operation of internal circuits 200, 300 and 400 in standby mode. In general, the greater the chip size, the greater the number of the first internal power drivers 110. The first internal power drivers 110 do not operate in a deep power-down mode, but generate the internal power supply voltage (Vint) in all modes (including standby mode) other than the deep power-down mode.

The plurality of second internal power drivers 120-1 to 120-n do not operate in standby mode or the deep power-down mode, and generate the internal power supply voltage (Vint) in all modes other than the deep power-down mode and standby mode.

The internal circuits, i.e., the VPP generator 200, the Vcore generator 300, the peripheral circuit 400, etc., are driven by the internal power supply voltage (Vint) generated from the first and second internal power drivers 110, 120-1 to 120-n.

Figure 3:
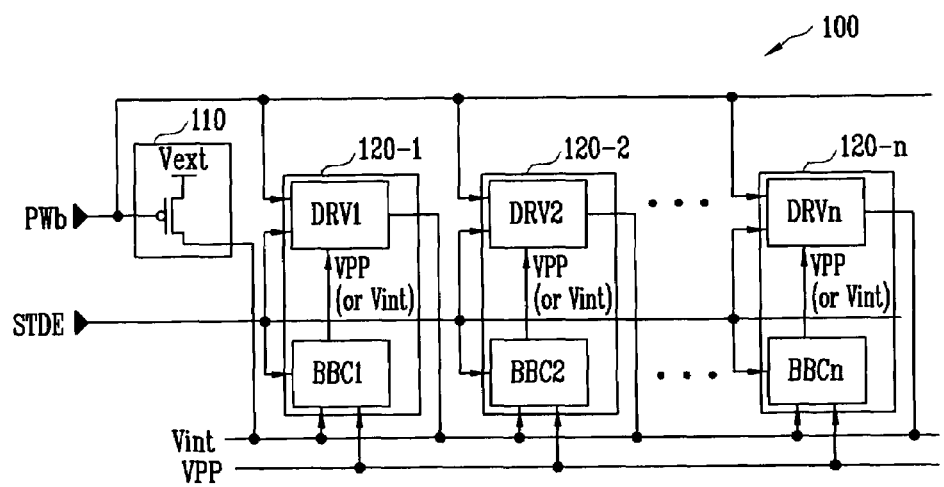
FIG. 3 is a detailed block diagram of the internal power supply voltage generating circuit shown in FIG. 2.

FIG. 3 is a detailed block diagram of the internal power supply voltage generating circuit 100 shown in FIG. 2.

Referring to FIG. 3, the first internal power drivers 110 do not generate the internal power supply voltage (Vint) in the deep power-down mode (i.e., stop the supply of current), but generate the internal power supply voltage (Vint) in all modes (including the standby mode) other than the deep power-down mode. Furthermore, the first internal power driver 110 consists of a PMOS transistor for generating an external power supply voltage (Vext) as the internal power supply voltage (Vint) in response to the deep power-down detection signal (PWb). The PMOS transistor is turned off the in deep power-down mode in response to the deep power-down detection signal (PWb) of a logical high, and is turned on in all modes other than the deep power-down mode in response to the deep power-down detection signal (PWb) of a logical low. When the PMOS transistor is turned on and the current flows, the internal power supply voltage (Vint) is generated.

Each of the second internal power drivers 120-1 to 120-n includes each of internal power supply voltage generators DRV1 to DRVn and each of back bias controllers BBC1 to BBCn.

Each of the internal power supply voltage generators DRV1 to DRVn does not generate the internal power supply voltage (Vint) in the deep power-down mode and the standby mode, but generates the internal power supply voltage (Vint) in all modes other than the deep power-down mode and the standby mode.

Furthermore, each of the internal power supply voltage generators DRV1 to DRVn receives the high voltage (VPP) as a back bias in standby mode and precludes the leakage current of the internal power supply voltage generator DRV that does not operate in standby mode, and receives the internal power supply voltage (Vint) as a back bias in all modes other than the deep power-down mode and the standby mode and generates the internal power supply voltage (Vint) using the external power supply voltage (Vext).

Each of the back bias controllers BBC1 to BBCn transfers the high voltage (VPP) to each of the internal power supply voltage generators DRV1 to DRVn in the standby mode, and transfers the internal power supply voltage (Vint) to each of the internal power supply voltage generators DRV1 to DRVn in all modes other than the standby mode. The high voltage (VPP) and the internal power supply voltage (Vint) output from the back bias controllers BB1 to BBCn are used as a back bias of each of the internal power supply voltage generators DRV1 to DRVn.

Figure 4:
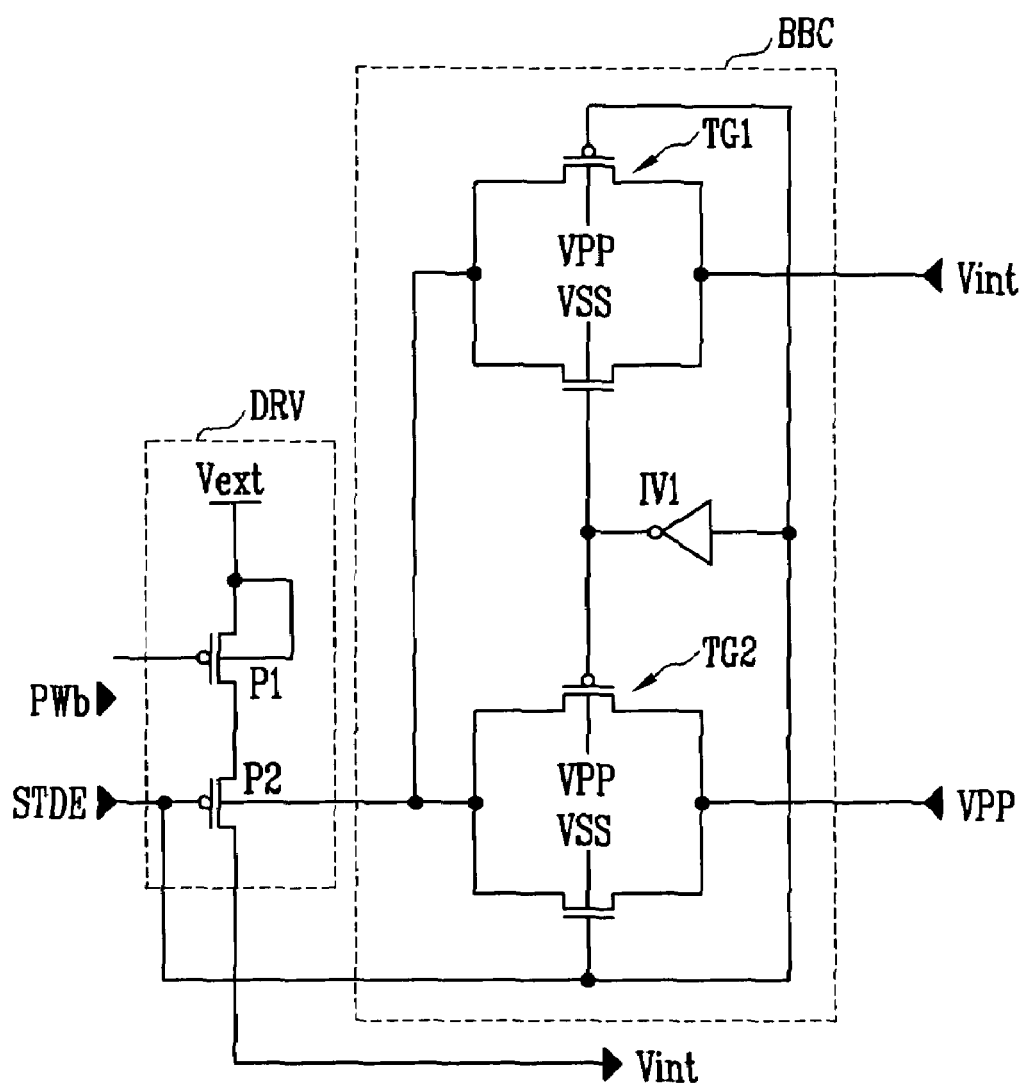
FIG. 4 is a detailed block diagram of an internal power driver shown in FIG. 3.

FIG. 4 is a detailed block diagram of the second power driver shown in FIG. 3.

Referring to FIG. 4, the internal power supply voltage generator DRV includes PMOS transistors P1, P2. The back bias controller BBC includes two transfer gates TG1, TG2 and an inverter IV1. In this case, the PMOS transistor P1 is used to preclude the supply of the internal power supply voltage (Vint) in the deep power-down mode, and does not generate the internal power supply voltage (Vint). The PMOS transistor P2 is used to preclude the supply of the internal power supply voltage (Vint) the in standby mode, and does not generate the internal power supply voltage (Vint). The transfer gate TG1 transfers the internal power supply voltage (Vint) as a back bias of the PMOS transistor P2 in all modes other than the standby mode. The transfer gate TG2 transfers the high voltage (VPP) as a back bias of the PMOS transistor P2 in the standby mode.

Hereinafter, the operation of each of constituent elements of the internal power supply voltage generator DRV will be described in more detail.

First, in the deep power-down mode, i.e., when the deep power-down detection signal (PWb) is a logical high, the PMOS transistor P1 is turned off, so that the internal power supply voltage (Vint) is not generated. In all modes other than the deep power-down mode, i.e., when the deep power-down detection signal (PWb) is a logical low, the PMOS transistor P1 is turned on to transfer the current generated by the external power supply voltage (Vext), thus generating the internal power supply voltage (Vint).

Next, in the standby mode, i.e., when a standby detection signal (STDE) is a logical high, the PMOS transistor P2 is turned off and the high voltage (VPP) as a back gate is applied, so that a threshold voltage (Vt) of the PMOS transistor P2 rises. If the threshold voltage of the PMOS transistor P2 rises, the leakage current is not generated although the PMOS transistor P2 is turned off. In all modes other than standby mode, i.e., when the standby detection signal (STDE) is a logical low, the PMOS transistor P2 is turned on, and the internal power supply voltage (Vint) is applied as a back gate (as a back bias). Thus, the internal power supply voltage (Vint) generated from the PMOS transistor P1 is output.

The operation of each of the constituent elements of the back bias controller BBC will be described below.

In the standby mode, i.e., when the standby detection signal (STDE) is a logical high, the transfer gate TG2 is turned on, so that the high voltage (VPP) is transferred thereto as a back gate of the PMOS transistor P2. In all modes other than standby mode, i.e., when the standby detection signal (STDE) is a logical low, the transfer gate TG1 is turned on, so that the internal power supply voltage (Vint) is transferred as a back gate of the PMOS transistor P2 thereto.

The above descriptions can be summarized in short as follows. In the standby mode, only the first internal power drivers 110 operate to generate the internal power supply voltage (Vint), and the second internal power drivers 120-1 to 120-n do not operate. In the deep power-down mode, since the first and second internal power drivers 110, 120-1 to 120-n are not driven, the internal power supply voltage (Vint) is not generated. In all modes other than the standby mode and the deep power-down mode, both the first and second internal power drivers 110, 120-1 to 120-n operate to generate the internal power supply voltage (Vint).

As described above, in the standby mode, only the first internal voltage drivers 110 are driven but the remaining second internal voltage drivers 120-1 to 120-n are not driven, in order to maintain a minimum internal power supply voltage level necessary for driving the internal circuits. It is thus possible to reduce the leakage current in the standby mode. That is, the number of transistors constituting drivers is reduced due to the reduction of the number of drivers that are driven. Accordingly, a channel leakage current of the transistors is reduced.

As described above, according to the present invention, the leakage current is reduced in standby mode of a PSRAM and other mobile device. Accordingly, the entire power consumption can be significantly reduced. This leads to an increased use time of mobile devices necessary for low-power consumption.

What is claimed is:

1. An internal power supply voltage generating circuit, comprising:
   at least one or more first internal power drivers configured not to generate an internal voltage in deep power-down mode, but to generate an internal power supply voltage in all modes other than the deep power-down mode and a standby mode; and
   a plurality of second internal power drivers configured not to generate the internal power supply voltage in the deep power-down mode and the standby mode, but to generate the internal power supply voltage all modes other than the deep power-down mode and the standby mode.

2. The internal power supply voltage generating circuit as claimed in claim 1, wherein each of the first internal power drivers includes a transistor for generating the internal power supply voltage using an external power supply voltage in all modes other than the deep power-down mode, and the standby mode.

3. The internal power supply voltage generating circuit as claimed in claim 1, wherein each of the second internal power drivers receives a high voltage as a back bias in the standby mode, and precludes the leakage current.

4. The internal power supply voltage generating circuit as claimed in claim 1, wherein each of the second internal power drivers includes:
   a back bias controller configured to transfer the internal power supply voltage in all modes other than the standby mode and transfer a high voltage in the standby mode; and
   an internal power supply voltage generator configured to receive the internal power supply voltage from the back bias controller as a back bias in all modes other than the standby mode and generate the internal power supply voltage, and to receive the high voltage from the back bias controller as a back bias in the standby mode and preclude the leakage current.

5. The internal power supply voltage generating circuit as claimed in claim 4, wherein the back bias controller includes a first transfer gate that is turned on in all modes other than the standby mode to transfer the internal power supply voltage; and a second transfer gate that is turned on in the standby mode to transfer the high voltage.

6. The internal power supply voltage generating circuit as claimed in claim 4, wherein the internal power supply voltage generator includes:
   a first transistor configured not to generate the internal power supply voltage in a deep power-down mode, but to generate the internal power supply voltage using the external power supply voltage in all modes other than the deep power-down mode and a standby mode; and
   a second transistor configured not to output the internal power supply voltage generated from the first transistor in the standby mode, but to output the internal power supply voltage generated from the first transistor in all modes other than the standby mode.

7. An internal power supply voltage generating circuit, comprising:
   one or more first internal power drivers configured to generate an internal power supply voltage in all modes other than a deep power-down mode, and a standby mode;
   a plurality of controllers configured to transfer a high voltage in the standby mode and transfer the internal power supply voltage in all modes other than the standby mode; and
   a plurality of second internal power drivers configured to receive the internal power supply voltage from each of the plurality of controllers as a back bias in all modes other than the deep power-down mode and the standby mode and generate the internal power supply voltage, and to receive the high voltage from each of the plurality of controllers as a back bias in standby mode and preclude the leakage current.

8. The internal power supply voltage generating circuit as claimed in claim 7, wherein each of the first internal power drivers includes a transistor for generating the internal power supply voltage using an external power supply voltage in all modes other than the deep power-down mode, and the standby mode.

9. The internal power supply voltage generating circuit as claimed in claim 7, wherein each of the plurality of controllers includes:
   a first transfer gate configured to transfer a high voltage of each of the plurality of second internal power drivers as a back bias in the standby mode; and
   a second transfer gate configured to transfer an internal power supply voltage of each of the plurality of internal power drivers as a back bias in all modes except for the standby mode.

10. The internal power supply voltage generating circuit as claimed in claim 7, wherein each of the second internal power supply voltage drivers includes:
    a first transistor configured not to generate the internal power supply voltage in the deep power-down mode, but to generate the internal power supply voltage using the external power supply voltage in all modes other than the deep power-down mode; and
    a second transistor configured not to output the internal power supply voltage generated from the first transistor in the standby mode, but to output the internal power supply voltage generated from the first transistor in all modes other than the standby mode.

11. The internal power supply voltage generating circuit as claimed in claim 10, wherein the second transistor receives the high voltage as a back gate in the standby mode to preclude the leakage current.

* * * * *